(12) United States Patent
Takagi et al.

(10) Patent No.: US 11,257,611 B2
(45) Date of Patent: Feb. 22, 2022

(54) SUPERCONDUCTING WIRE ROD AND SUPERCONDUCTING COIL

(71) Applicant: FURUKAWA ELECTRIC CO., LTD., Tokyo (JP)

(72) Inventors: Tomohiro Takagi, Tokyo (JP); Toru Fukushima, Tokyo (JP); Hisaki Sakamoto, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 462 days.

(21) Appl. No.: 16/011,327

(22) Filed: Jun. 18, 2018

(65) Prior Publication Data

US 2018/0301249 A1  Oct. 18, 2018

Related U.S. Application Data

(63) Continuation of application No. PCT/JP2016/087404, filed on Dec. 15, 2016.

(30) Foreign Application Priority Data

Dec. 18, 2015  (JP) .............................. JP2015-247909

(51) Int. Cl.
*H01B 12/06* (2006.01)
*H01F 6/06* (2006.01)
(Continued)

(52) U.S. Cl.
CPC ......... *H01B 12/06* (2013.01); *H01B 13/0036* (2013.01); *H01F 6/06* (2013.01); *H01F 27/2871* (2013.01); *H01L 39/143* (2013.01); *H01L 39/2454* (2013.01); *H02H 7/001* (2013.01); *H01F 6/02* (2013.01); *Y02E 40/60* (2013.01)

(58) Field of Classification Search
CPC ........................... H01B 12/06; H01B 13/0036
See application file for complete search history.

(56) References Cited

U.S. PATENT DOCUMENTS

2006/0077025 A1  4/2006 Funaki et al.
2006/0258539 A1*  11/2006 Matsumoto ......... H01L 39/2487
505/100
(Continued)

FOREIGN PATENT DOCUMENTS

JP  5-151836 A  6/1993
JP  2005-085612 A  3/2005
(Continued)

OTHER PUBLICATIONS

Translation of WO 2015170699 (Year: 2015).*
(Continued)

*Primary Examiner* — Paul A Wartalowicz
(74) *Attorney, Agent, or Firm* — Birch, Stewart, Kolasch & Birch, LLP

(57) ABSTRACT

A superconducting wire rod according to an aspect of the present disclosure is a superconducting wire rod having a flat cross-sectional shape which is characterized in that a voltage is generated with a lower current density or a higher voltage is generated with the same current density in a region on at least one end side in a wire rod width direction as compared with a region other than the region on the at least one end side.

2 Claims, 6 Drawing Sheets

(51) Int. Cl.
*H01L 39/14* (2006.01)
*H01B 13/00* (2006.01)
*H01F 27/28* (2006.01)
*H01L 39/24* (2006.01)
*H02H 7/00* (2006.01)
*H01F 6/02* (2006.01)

(56) References Cited

U.S. PATENT DOCUMENTS

| | | |
|---|---|---|
| 2012/0181062 A1 | 7/2012 | Neumüller et al. |
| 2016/0359097 A1 | 12/2016 | Kurihara |

FOREIGN PATENT DOCUMENTS

| | | |
|---|---|---|
| JP | 4657921 B2 | 3/2011 |
| JP | 4996511 B2 | 8/2012 |
| JP | 2013-004457 A | 1/2013 |
| JP | 2013-503422 A | 1/2013 |
| JP | 5597711 B2 | 10/2014 |
| WO | WO 2015/170699 A1 | 11/2015 |

OTHER PUBLICATIONS

International Preliminary Report on Patentability and English translation of the Written Opinion of the International Searching Authority (Forms PCT/IB/373 and PCT/ISA/237) for International Application No. PCT/JP2016/087404, dated Jun. 19, 2018.
Japanese Notice of Reasons for Refusal for corresponding Japanese Application No. 2017-556444, dated Oct. 12, 2020, with an English translation.
Amemiya et al., "Temporal behaviour of multipole components of the magnetic field in a small dipole magnet wound with coated conductors", Superconductor Science and Technology, vol. 28, 2015, pp. 1-17.
International Search Report (PCT/ISA/210) issued in PCT/JP2016/087404, dated Mar. 7, 2017.
Written Opinion (PCT/ISA/237) issued in PCT/JP2016/087404, dated Mar. 7, 2017.

* cited by examiner

SUPERCONDUCTING WIRE ROD AND SUPERCONDUCTING COIL

CROSS REFERENCE TO RELATED APPLICATIONS

This application is a Continuation of PCT International Application No. PCT/JP2016/087404, filed on Dec. 15, 2016, which claims priority under 35 U.S.C. 119(a) to Patent Application No. 2015-247909, filed in Japan on Dec. 18, 2015, all of which are hereby expressly incorporated by reference into the present application.

BACKGROUND

Technical Field

The present disclosure relates to a superconducting wire rod and a superconducting coil in which a superconducting wire rod is wound in a coil shape, for example, in a spiral shape or in a helical shape.

Background

Superconducting devices using superconducting wire rods such as superconducting coils are widely used. An AC loss has been a serious problem in such superconducting devices mainly for the following two reasons.

A first reason resides in that electric power consumed by the AC loss is converted to heat, resulting in increase of the temperature of a superconducting device for which extremely low temperature cooling is required. The ratio of the AC loss of a superconducting coil to the power consumption of the entire system is only a small one. However, the capacity of a cooling mechanism must be enhanced to cope with heat caused by the AC loss, with the result that the introduction cost and running cost of a cooling mechanism increases. This has caused a serious problem from the viewpoint of practical use.

A second reason resides in that the AC loss becomes larger in a device using a superconductor than that in a device using a normal conductor. AC losses such as a hysteresis loss (a so-called iron loss) and an eddy current loss (a so-called copper loss) also exist in the device using the normal conductor (a motor or the like). On the other hand, in the superconducting device, the superconductor itself causes a hysteresis loss and an AC loss similar to the hysteresis loss. Furthermore, the superconducting device is cooled to an extremely low temperature together with peripheral members of the superconducting device, so that the electrical conductivity of the superconducting device increases literally extraordinarily by an order level, and the eddy current loss may increase in proportion to the increase of the electrical conductivity. Therefore, the amount of loss of the superconducting device is surely increased as compared with that of the device using the normal conductor.

A superconducting wire rod having a flat cross-sectional shape such as a REBCO wire rod which has been expected to be applied as a high-temperature superconducting (HTS) wire rod has, particularly, a problem in that the hysteresis loss is large. This is caused by the shape of a superconducting layer constituting a superconducting wire rod, which is a flat cross-sectional shape, in other words, a wide and tape-like shape. On the other hand, with respect to superconducting wire rods such as an Nb-based superconducting wire rod and a Bi-based superconducting wire rod, a superconducting region is formed of a plurality of filaments (thin lines), and a hysteresis loss hardly occurs.

Focusing on the shapes of such wire rods, with respect to the REBCO wire rod having a wide and tape-like superconducting layer, it has been hitherto proposed that the hysteresis loss is reduced by segmenting the superconducting layer into a plurality of fine wires to reduce the width of the superconducting layer. The source of the hysteresis loss in the superconducting wire rod is the magnetic moment of a shielding current occurring in the superconducting wire rod, and the magnetic moment becomes small by reducing the width of a shielding current circuit, so that an effect of reducing the hysteresis loss is expectable. For example, Japanese Patent No. 4657921 describes a method of dividing a superconducting thin film constituting a tape type high-temperature superconducting wire rod into a plurality of narrow superconducting thin film portions, and electrically separating the divided superconducting thin film portions from one another to reduce the hysteresis loss.

However, the above-described method has the following problems. That is, when a rod wire is manufactured, a defective portion having a lower critical current than other portions may be formed locally due to contamination of a substrate, development of sudden anisotropy or the like. Here, the critical current is a current with which a constant voltage occurs per length of a superconducting wire rod. Specifically, the critical current is a current which generates, for example, a voltage of 1 μV per 1 cm in length. When the defective portion is small, more specifically, when spreading of the defective portion in a wire rod width direction is sufficiently smaller than the width of the wire rod, from the viewpoint of an influence on the whole wire rod, the influence remains limited. However, in the method described in Japanese Patent No. 4657921, the wire rod is divided into a plurality of completely insulated lines (superconducting thin film portions), and thus when a small defect covers one of the divided lines over the width of the line, the critical current of the line remarkably decreases as compared with the other lines, so that the critical current of the rod wire also decreases as a whole by the amount corresponding to the decrease of the critical current of the line. Or, when grooves are formed in the superconducting layer in a wire rod dividing step, the current is likewise difficult to flow due to even partially slight expansion of the grooves.

In order to overcome the disadvantages of the disclosure described in Japanese Patent No. 4657921 described above, Japanese Patent No. 4996511 describes a method of not perfectly insulating the divided lines from each other as described in Japanese Patent No. 4657921, but filling metal in the groove to be divided to thereby allow some degree of electrical conduction.

Furthermore, Japanese Patent Laid-Open No. 2005-85612 and Japanese Patent No. 5597711 describe that a superconducting wire rod is divided into a plurality of lines by a plurality of parallel grooves extending in an inclined fashion with respect to a wire rod longitudinal direction, and the respective divided lines are made to meander in zigzags so as to realize dislocation between the lines, thereby reducing the shielding current and the hysteresis loss.

However, in the disclosure described in Japanese Patent No. 4996511, as the length of the wire rod increases, the electrical resistance between the lines becomes extremely small even when the grooves are filled with metal having high resistance because the grooves have the same length as the length of the wire rod. Therefore, it may be impossible to confine current in the divided lines. In this case, it cannot be prevented that a shielding current serving as a source of the hysteresis loss is formed over the entire wire rod, and the effect of reducing the hysteresis loss cannot be sufficiently obtained.

Furthermore, the disclosures described in Japanese Patent Laid-Open No. 2005-85612 and Japanese Patent No. 5597711 have a problem in that metal portions which are normal conductors exist periodically on a current path, and thus heat caused by a certain amount of a Joule loss is generated at all times due to application of current.

The present disclosure is related to providing a superconducting wire rod having a flat cross-sectional shape capable of reducing a hysteresis loss while avoiding decrease of a critical current, and suppressing heat generation, and a superconducting coil using the same.

SUMMARY (1) A superconducting wire rod according to a first aspect of the present disclosure is a superconducting wire rod having a flat cross-sectional shape which is characterized in that a voltage is generated with a lower current density or a higher voltage is generated with the same current density in a region on at least one end side in a wire rod width direction as compared with a region other than the region on the at least one end side. Here, what amount of voltage occurs with a certain current density in a certain region of the wire rod can be known, for example, by digging grooves so as to electrically insulate a superconducting portion in the region from a superconducting portion outside the region, applying a constant current to the respective regions, and measuring a voltage generated at that time.

According to the first aspect of the present disclosure, a region on at least one end side is provided with a mechanism for making a voltage occur with a low current density, whereby formation of a shielding current band serving as a source for a hysteresis loss is inhibited. Therefore, the hysteresis loss can be reduced while avoiding decrease of the critical current.

(2) A superconducting wire rod according to a second aspect of the present disclosure is a superconducting wire rod having a flat cross-sectional shape which is characterized in that a superconducting layer of the superconducting wire rod is provided with grooves that extend from one end or both ends in a wire rod width direction in an inclined fashion with respect to a wire rod longitudinal direction, and terminate without reaching another end, and whose grooves are filled with metal.

According to the second aspect of the present disclosure, the grooves which extend from one end or both ends in the wire rod width direction while in an inclined fashion with respect to the wire rod longitudinal direction, and terminate without reaching the other end, whereby formation of a shielding current band serves as a source of a hysteresis loss. Therefore, the hysteresis loss can be reduced while avoiding decrease of the critical current.

(3) A superconducting wire rod according to a third aspect of the present disclosure is characterized in that an average value of lengths of the grooves is different according to a position in the wire rod longitudinal direction in the second aspect.

(4) A superconducting wire rod according to a fourth aspect of the present disclosure is characterized in that the superconducting wire rod is used as a wire rod for a superconducting pancake coil wound spirally within an identical plane, and the average value of the lengths of the grooves increases to an outside in a radial direction of the superconducting pancake coil in the third aspect.

(5) A superconducting wire rod according to a fifth aspect of the present disclosure is characterized in that a critical current density of a region on at least one end side in a wire rod width direction is equal to or less than half of a maximum value of a critical current density of a region other than the region on the at least one end side. Here, the critical current density in the wire rod can be measured by digging the grooves for insulating the superconducting portions as described above, and can also be known by measuring a flux variation distribution when an external magnetic field is applied.

According to the fifth aspect of the present disclosure, the critical current density on the at least one end side is equal to or less than half of the maximum value of the critical current density of the region other than the region on the at least one end side, thereby inhibiting formation of the shielding current band serving as the source of the hysteresis loss. Therefore, the hysteresis loss can be reduced while avoiding decrease of the critical current.

(6) A superconducting wire rod according to a sixth aspect of the present disclosure is characterized in that the critical current density of the at least one end side has a slope distribution of critical current values in which the critical current density of the at least one end side is lower than the critical current density of the region other than the region on the at least one end side in the fifth aspect.

According to the superconducting wire rod of the sixth aspect of the present disclosure, the superconducting wire rod has the slope distribution of the critical current so that the critical current density on the at least one end side is reduced, thereby inhibiting formation of the shielding current band serving as the source of the hysteresis loss. Therefore, the hysteresis loss can be reduced by avoiding the decrease of the critical current.

(7) A superconducting wire rod of the foregoing disclosure is suitable to configure the superconducting coil in any aspect.

According to the present disclosure, the hysteresis loss can be reduced while avoiding the decrease of the critical current, and heat generation can be suppressed.

DETAILED DESCRIPTION

A mode for carrying out the present disclosure (hereinafter referred to as "present embodiment") will be described by presenting specific examples. The present embodiment relates to a superconducting wire rod having a flat cross-sectional shape and a superconducting coil using the superconducting wire rod. Here, the flat cross-sectional shape is a shape having an aspect ratio of 3 or more. Prior to description on a superconducting coil to which the present disclosure is applied, a superconducting wire rod having a flat cross-sectional shape according to the present disclosure will first be described hereunder by presenting specific examples.

(1) SUPERCONDUCTING WIRE ROD

Figure 1:
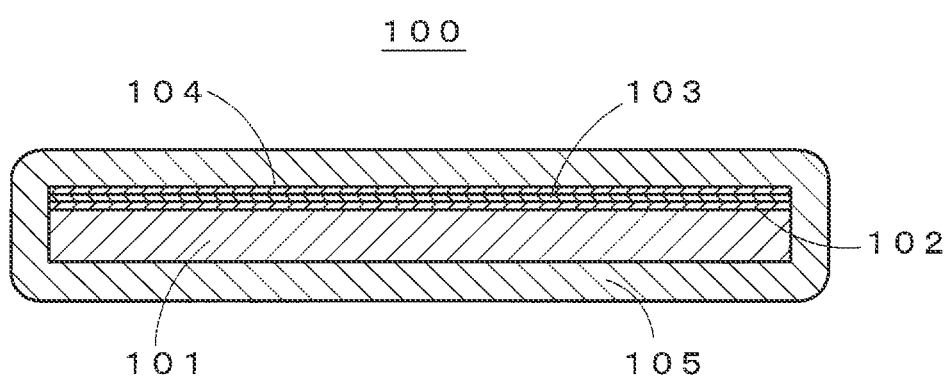
FIG. 1 is a cross-sectional view showing a laminate structure of a REBCO wire rod.

For example, a REBCO wire rod formed of a copper oxide superconductor having a composition formula represented by $REBa_2Cu_3O_{7-x}$ (RE represents a rare earth element) may be cited as a superconducting wire rod having a flat cross-sectional shape. FIG. 1 is a cross-sectional view showing an example of the laminate structure of the REBCO wire rod.

A REBCO wire rod 100 shown in FIG. 1 is obtained by successively laminating an intermediate layer 102, a REBCO superconducting layer 103 and a protective layer 104 on one surface of a substrate 101, and further coating the periphery of the laminate with a stabilizing layer 105. Nickel-based alloy represented by Hastelloy (registered trademark), stainless steel or the like is used for the substrate 101. The intermediate layer 102 is a layer serving as a base of the superconducting layer 103, and a material in which physical characteristic values such as a thermal expansion coefficient and a lattice constant show intermediate values between the substrate 101 and the superconductor constituting the REBCO superconducting layer 103, for example, LaMnO3 (LMO) is used for the intermediate layer 102. The REBCO superconducting layer 103 is formed of a high-temperature superconductor made of rare earth atoms such as yttrium, copper oxide or the like. The protective layer 104 is a layer covering the surface of the superconducting layer 103, and for example, silver is used for the protective layer 104. The stabilizing layer 105 is a layer covering the periphery of the laminate obtained by successively laminating the intermediate layer 102, the REBCO superconducting layer 103 and the protective layer 104 on the substrate 101 as described above, and for example, copper is used for the stabilizing layer 105.

(2) HYSTERESIS LOSS OF SUPERCONDUCTOR

Next, a mechanism in which the REBCO wire rod 100 described above causes a hysteresis loss will be described. First, when a tape-type REBCO wire rod 100 extended in a straight line is placed in a varying magnetic field which directs so as to penetrate in the thickness direction of the tape-type REBCO wire rod 100, a current loop is formed so as to loop the inner part of the REBCO superconducting layer 103 in the same manner as an eddy current in a normal conductor. The eddy current does not become so large as to exert a significant influence on the surrounding magnetic field because of the electrical resistance of the normal conductor. On the other hand, a current loop which is sufficient to completely cancel the variation of the magnetic field inside the superconductor is formed in the REBCO superconducting layer 103 having no electrical resistance. Therefore, such a current loop formed in the superconductor is called a shielding current.

Figure 2:
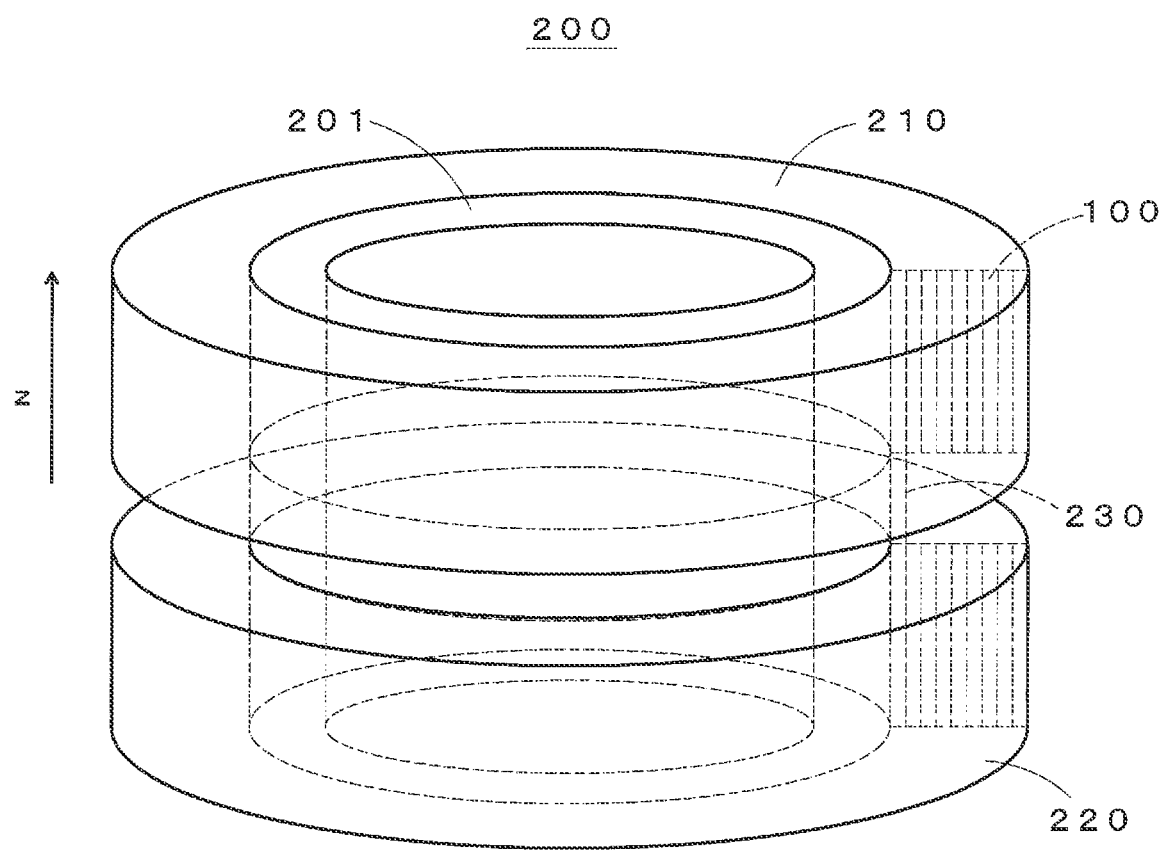
FIG. 2 is a perspective view showing a double pancake coil formed of a high-temperature superconducting wire rod.

FIG. 2 is a perspective view showing a double pancake coil 200 formed of a high-temperature superconducting wire rod as a specific example of the superconducting coil manufactured by using the foregoing REBCO wire rod 100. The double pancake coil 200 includes an upper pancake coil 210 in which a REBCO wire rod 100 is wound in a spiral shape on the same plane at an upper portion of a bobbin 201, and a lower pancake coil 220 in which the REBCO wire rod 100 is wound in a spiral shape on the same plane at a lower portion of the bobbin 201. The double pancake coil 200 has electrical conductivity via a bridging portion 230 located at the innermost turn.

In the superconducting pancake coil using the REBCO wire rod 100 as shown in FIG. 2, a shielding current is formed such that current concentrates on the outside in the axial direction of both the pancake coils under energization (increase of energization current of the coil). In this case, a current loop is not formed, but variation of magnetic flux penetrating through the wire rod in the radial direction of the coil (in the thickness direction of the wire rod) is offset by this shielding current in inner regions in the axial direction of both the pancake coils. Such a shielding current formed in the superconducting pancake coil will be hereinafter referred to as a shielding current band.

When a superconducting pancake coil which has been once energized is subsequently de-energized (energization current of the coil is decreased), a shielding current band formed under the energization is not simply reduced. Variation in a current density distribution occurs from the outside in the coil axial direction at all times. In this case, a shielding current band in a reverse direction is formed and grown on the outside in the coil axial direction, so that the energization current of the entire coil decreases.

A similar description regarding the variation of the current density distribution described above is made, for example, in Non-Patent Document 1 (Naoyuki Amemiya, 6 others, "Temporal behaviour of multipole components of the magnetic field in a small dipole magnet wound with coated conductors", Superconductor Science and Technology, IOP-science, 2015, 035003, p. 1-17).

Figure 3A:
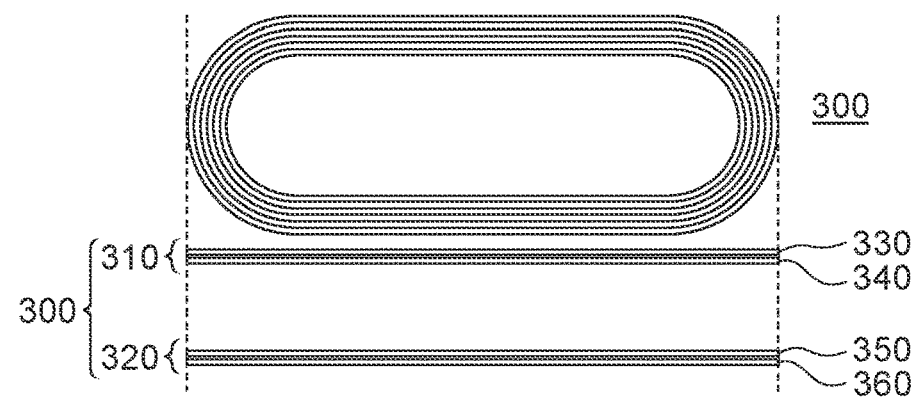
FIGS. 3A, 3B and 3C are diagrams showing a mechanism for causing a hysteresis loss in a superconducting coil.
Figure 3B:
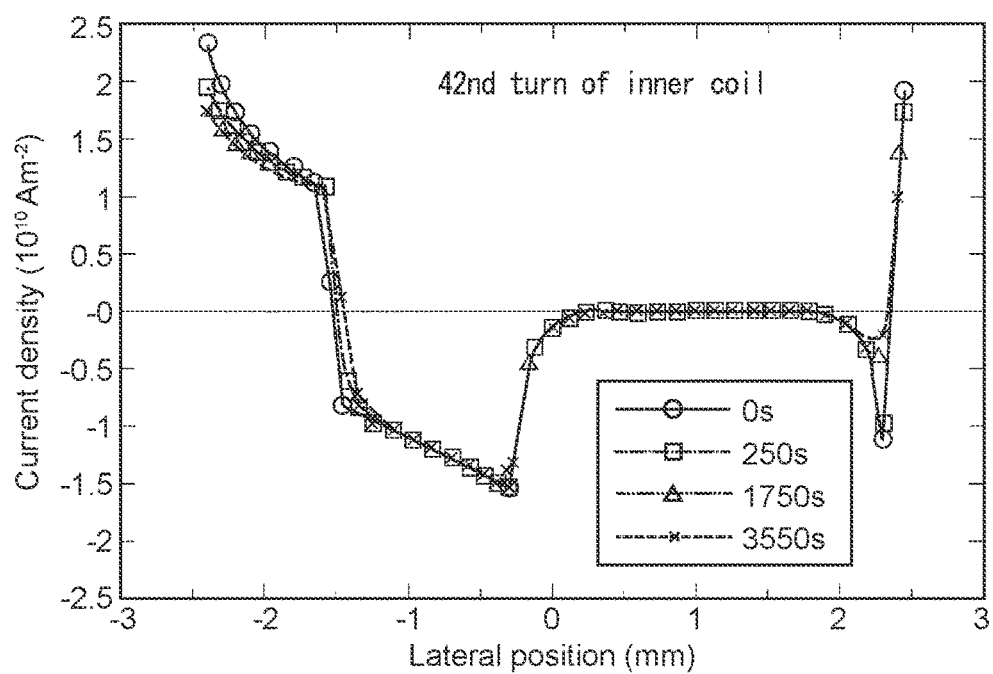
Figure 3C:
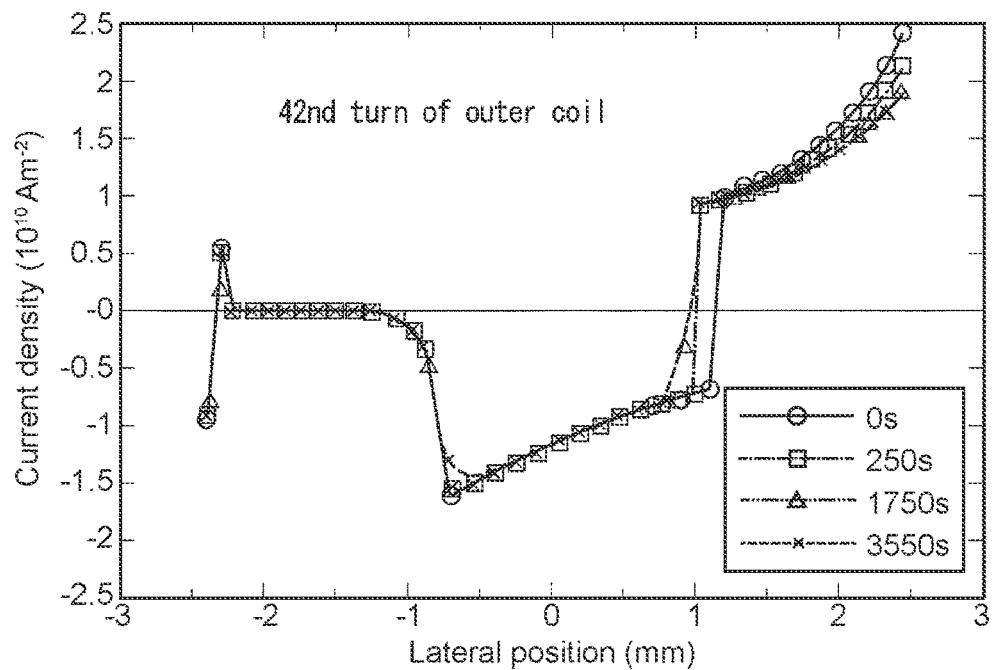

Parts of FIG. 2 and FIG. 19 shown in the Non-Patent Document 1 are shown in FIGS. 3A, 3B and 3C. FIGS. 3A, 3B and 3C show current density distributions in the wire-rod width direction at the 42nd turns as intermediate turns of two pancake coils constituting a double pancake coil when energization is performed until 50 A and then de-energization is performed until 0 A in a superconducting coil system including two pairs of superconducting double pancake coils. FIG. 3A is a diagram showing a configuration of a superconducting coil system 300 in which two pairs of superconducting double pancake coils 310, 320 comprise four race track type superconducting pancake coils 330, 340, 350 and 360, FIG. 3B shows a current density distribution of coils 340, 350 located inside (hereinafter referred to as "inner coils") out of the four pancake coils, and FIG. 3C shows a current density distribution of coils 330, 360 located outside (hereinafter referred to as "outer coils"). In FIGS. 3B and 3C, the left side of the abscissa axis corresponds to the center side of the superconducting coil system 300, and FIG. 3B showing the inner coils is in positional relationship to be located just on the left side of FIG. 3C showing the outer coils. A right-side region of FIG. 3B and a left-side region of FIG. 3C are "regions where variation of magnetic field is offset", shielding current bands in the forward direction (signs are negative in FIGS. 3B and 3C) formed under energization are shown just on the outside of the above regions, and shielding current bands in the reverse direction formed under de-energization are shown on the further outside of the above regions. FIGS. 3B and 3C also show transitions of the current density distributions from just after completion of the de-energization of the respective coils (0 s) until a lapse of 3550 seconds. From these figures, it is apparent in this superconducting coil system that even when a constant-current operation containing a zero-current operation is continued for 3550 seconds, the current density distributions hardly vary, that is, the shielding current bands are not spontaneously mitigated.

These shielding current bands make magnetic flux in the region surrounded by the shielding current bands, and thus they have magnetic moments. The shielding current band in the forward direction and the shielding current band in the reverse direction have magnetic moments in opposite directions to each other, and repulse each other. Therefore, this state is regarded to have high energy in terms of the magnetic moment. Energy consumed to create this high energy state is a hysteresis loss. The hysteresis loss in ferromagnetic material is different in that it is derived from the magnetic moments possessed by electron spins in the ferromagnetic material, but is the same in mechanism.

When this superconducting coil system is energized up to 50 A again, at this time, a shielding current band in the forward direction is formed on the outside (the left side of FIG. 3B and the right side of FIG. 3C) of the above regions, and the shielding current band in the reverse direction is eroded by the above shielding current band and finally extinguished. The shielding current band in the forward direction formed at this time can be regarded as an assembly of shielding current bands in the same direction, and these shielding current bands are attracted to one another because they have magnetic moments in the same direction. Therefore, this state may be regarded to have low energy in terms of the magnetic moment. Under the transition from the high-energy state to the low-energy state as described above, differential energy is released, and this energy generates heat in the coils. This is the mechanism in which the hysteresis loss causes generation of heat in the superconducting coil.

(3) FIRST EMBODIMENT

In the double pancake coil 200 shown in FIG. 2, shielding current bands are formed under energization/de-energization on the outside in the coil axial direction, that is, on the side in the wire rod width direction z where the other pancake coil does not exist (hereinafter also referred to as "the outside in the wire rod width direction" or simply "the outside in the width direction") as in the case of the superconducting coil system 300 comprising the two pairs, four superconducting pancake coils, and this shielding current band serves as a source for generating a hysteresis loss and heat generation associated with the hysteresis loss. That is, in the double pancake coil 200 shown in FIG. 2, current density distributions similar to those formed on the left side of FIG. 3B and the right side of FIG. 3C are formed on the outside in the width direction of the pancake coil 200. Focusing on the formation process of the shielding current described above, in the high-temperature superconducting wire rod according to the present embodiment, a mechanism for inhibiting formation of the shielding current band is provided to end regions on the outside in the width direction (150A to 150B shown in FIG. 4A and FIG. 5 described later). Specifically, the end region on the outside in the width direction generates a voltage with a lower current density or generates a higher voltage with the same current density as compared with the other region than the end region. As a result, the hysteresis loss in the superconducting coil can be reduced.

Figure 4A:
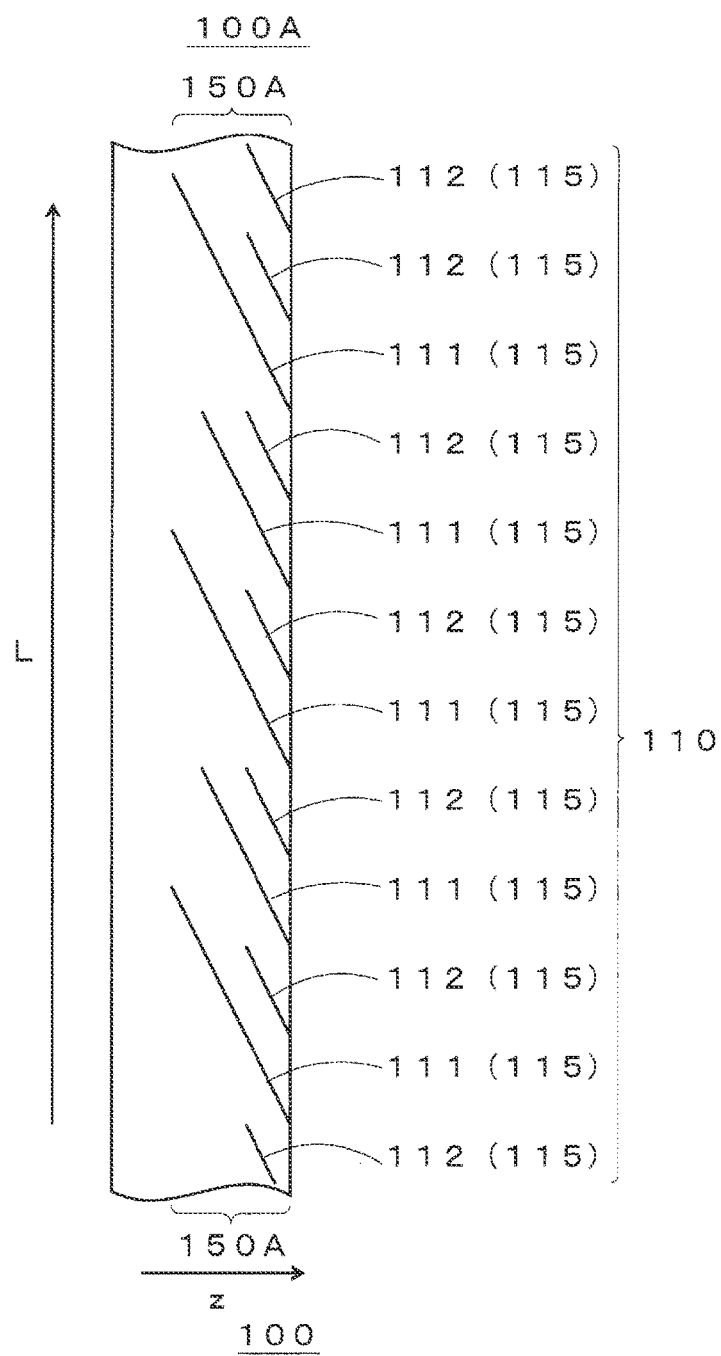
FIGS. 4A and 4B are diagrams showing a high-temperature superconducting wire rod according to a first embodiment to which the present disclosure is applied.

In a high-temperature superconducting wire rod 100A according to the first embodiment, first, a protective layer 104 is formed on a superconducting layer 103, and then, as shown in FIG. 4A, grooves 110 are formed in an end region 150A on an outside in the width direction so as to extend from the surface of the rod wire to the superconducting layer 103, and filled with metal having a high electrical conductivity, for example, metal having specific resistance (the reciprocal of electrical conductivity) smaller than 2.5 $\mu\Omega\cdot$cm at room temperature. Gold, silver, copper or the like is known to be such metal. That is, metal layers 115 are deposited in the grooves 110. The structure as described above generates a voltage with a lower current density or generates a higher voltage with the same current density in the end region 150A on the outside in the width direction as compared with the other region. The depth of the grooves are desired to be set so that the superconducting layer is completely parted. In the case of the REBCO wire rod 100 in which the superconducting layer is formed on the substrate, the grooves may be dug so as to extend to the intermediate layer 102 located below the superconducting layer 103 or the upper portion of the substrate 101. On the other hand, in the case of a BSCCO wire rod formed of a bismuth-based superconductor in which a superconducting layer is formed inside a metal sheath, since the superconducting layer has a large thickness of 100 µm or more, a sufficient effect can be expected even when the superconducting layer remains, for example by not more than 10 µm thickness which corresponds to 10% of the thickness of the superconducting layer. FIG. 4A shows the inclined angle in a great exaggeration of the grooves 110 for convenience of explanation, but in actuality the inclined angle is a very small angle of 0.1 rad or less with respect to the wire rod longitudinal direction. Furthermore, FIG. 4A shows a state where the stabilizing layer 105 is removed.

With respect to the distribution of the grooves, it is preferable that the number of grooves be larger from the viewpoint of enabling homogenization. In order to increase the number of the grooves (density), the electrical resistance traversing each single groove may be reduced, and for this purpose, it is preferable that the width of the groove be smaller. Therefore, it is preferable that the width of the groove 110 is not more than 100 µm, and it is further preferable that the width of the groove 110 is not more than 50 µm. However, when the width of the groove decreases to be equal to or less than the depth of the groove, it is difficult to uniformly embed the inside of the groove with metal, and thus it is preferable that the width of the groove 110 be larger than the depth. For example, when the grooves 110 are formed while the thickness of the superconducting layer 103 is equal to 1 µm and the protective layer of silver having a thickness of 5 µm is formed on the superconducting layer 103, the depth of the grooves 110 is equal to 6 µm or more. Accordingly, in this case, it is preferable that the width of the grooves 110 is equal to 6 µm or more.

Figure 4B:
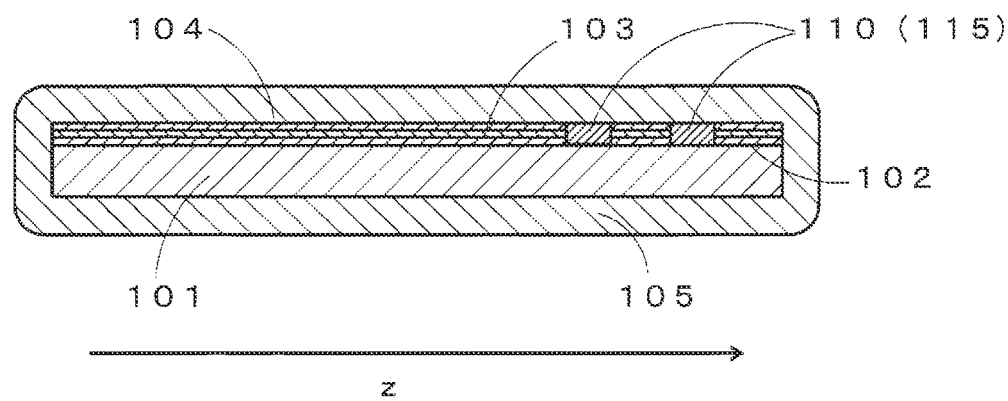

After the grooves 110 are formed, a stabilizing layer 105 is formed. As a result, the cross-section of the high-temperature superconducting wire rod 100A becomes as shown in FIG. 4B. Since the stabilizing layer 105 is also formed on the grooves 110, appearance of the grooves is such that traces of the grooves are recognized as an uneven structure of the stabilizing layer 105.

Here, when the double pancake coil 200 is made by one high-temperature superconducting wire rod 100A, the outside and the inside in the coil axial direction are reversed with respect to the wire rod between the upper pancake coil 210 and the lower pancake coil 220. In consideration of this point, when the wire rod is grooved, the grooved side must be reversed with the center of the wire rod during coiling as a boundary.

Specific morphology of the grooves 110 will be described. In order to make the grooves 110 function as obstacles to the shielding current band, the grooves are configured so as to extend from one end or both ends in the width direction while in an inclined fashion with respect to the longitudinal direction L of the wire rod in FIG. 4A, and the lengths of the grooves are set so as to terminate without reaching the other end and so as not to completely traverse the wire rod in the wire rod width direction z in FIG. 4A. Here, the reason why the grooves 110 are dug while in an inclined fashion is due to the fact that when the grooves are formed so as to extend in parallel to the wire-rod width direction z, shielding current bands are formed without being inhibited in most of the region where no groove is provided when viewed in the longitudinal direction L, and the effect of reducing the hysteresis loss cannot be sufficiently obtained. Furthermore, the grooves 110 are not necessarily parallel to one another.

Furthermore, it is preferable that the lengths in the wire-rod longitudinal direction L of the grooves 110 be longer than the interval in the wire-rod longitudinal direction L at which the grooves 110 are dug. For example, when grooves 110 corresponding to a 1 mm portion in the wire rod width direction z are dug at intervals of 10 cm in the wire-rod longitudinal direction L, it is preferable that one groove has a length of 10 cm or more in the wire-rod longitudinal direction L. By setting the lengths as described above, partial formation of shielding current bands can be effectively inhibited.

The grooves 110 may be configured, for example, so that short grooves 112 and long grooves 111 are mixed as shown in FIG. 4A. By mixing the short grooves 112 and the long grooves 111 as described above, inside a region in the width direction of the high-temperature superconducting wire rod 100A in which the grooves 110 are formed, a density of the grooves 110 present in an outer region in the width direction is higher than the density of the grooves 110 present in a slightly inner region in the width direction. This is preferable in that formation of a shielding current band can be inhibited at even a slightly inner position from the outside in the width direction, and also heat generation caused by an induced Joule loss (hereinafter referred to as "Joule heat generation") can be suppressed to a small level. However, the grooves 110 are provided only in a region where the shielding current band is apt to be formed, and at least a portion of a region where the shielding current band is difficult to be formed is left intact without forming the grooves 110 there. By this configuration, an effect of inhibiting the shielding current can be obtained, and also the Joule heat generation can be suppressed.

With respect to the length and interval of the grooves 110 to be dug, etc., they are optimally designed in consideration of the current and magnetic field (current) varying environment under which the coil is driven.

That is, as compared with a case where no groove 110 is formed, the grooves 110 are formed so that the hysteresis loss is reduced and the total heat value which also considers the Joule heat generation, etc. is reduced. For example, when the mean square of energization current is sufficiently small as compared with a current at which a voltage, which is not induced electromotive force, starts to be generated in the coil (hereinafter referred to as "coil permissible current"), it is preferable that the average length in the width direction of the grooves 110 be increased. Here, the length in the width direction is the length of a width-direction component of the groove 110 which is in an inclined fashion with respect to the wire rod longitudinal direction L. By this configuration, the current can be enabled to concentrate on a narrower region in the width direction, resulting in enabling enhancement of the reduction rate of the hysteresis loss. On the other hand, when a large current flows in a wire rod in which the average length in the width direction of the grooves is large, current that cannot fit in a width-direction region to which grooves do not extend protrudes and flows to a width-direction region where grooves are formed. When this current gets over the grooves, not only the Joule heat is generated, but a shielding current band is also formed in the region where the grooves are formed, so that the effect of reducing the hysteresis loss deteriorates. For example, when inclined grooves traversing completely the wire rod in the width direction are uniformly formed, no difference occurs in induced voltage drop even when current flows at any position in the width direction. Therefore, a shielding current band generating a large hysteresis loss is formed as in the case of a wire rod in which no groove is formed.

When the coil is subjected to varying magnetic field varying at a high speed, it is preferable that the interval in the wire rod longitudinal direction L of the grooves 110 be short. For example, when applied to a coil to be alternately energized at a relatively large frequency of several tens Hz like a transformer, the effect of reducing the hysteresis loss does not become evident unless the interval in the wire rod longitudinal direction L of the grooves 110 is set to be short, that is, the number of the grooves is increased. Furthermore, when the energization current itself greatly varies as with alternating energization, the mean square of the energization current is lower than that under a constant-current driving operation. Therefore, as described above, it is preferable that the average length in the width direction of the grooves 110 be increased.

However, it is not necessarily better to shorten the interval in the wire rod longitudinal direction L of the grooves 110 as much as possible. In the case of the superconducting coil, a voltage occurs when the energization current exceeds its permissible current, and the temperature increases due to heat generation caused by the occurrence of the voltage. At this time, the critical current of the superconducting wire rod decreases, and the coil permissible current also decreases, so that the heat value increases more and more. The temperature suddenly increasing due to positive feedback as described above is called a quench. When a superconducting coil is made, it is normal to design a permissible current with a margin of 30 to 50% with respect to an expected energization current so that the quench does not occur immediately even when an abnormal situation such as overcurrent energization or increase in coil temperature occurs.

When the coil made of the superconducting wire rod 100A according to the first embodiment is slowly energized, a current distribution occurs in an intact region while avoiding a region where the grooves 110 are dug. When energization is further continued, upon exceeding the critical current in the intact region, a current distribution also occurs in the region where the grooves 110 are dug. Therefore, Joule heat occurs with even an energization current less than the coil permissible current. At this time, when the interval between the grooves 110 is excessively small, that is, the number of grooves 110 is excessively large, the thus-generated Joule heat increases, resulting in a risk of causing a quench. In other words, a problem whereby the tolerance of the coil to an abnormal situation such as overcurrent energization and increase of coil temperature decreases as the interval of the grooves 110 is shorter is apt to occur.

When the high-temperature superconducting wire rod 100A is used for the pancake coil, it is preferable in the high-temperature superconducting wire rod 100A that the average value of the lengths of the inclined grooves 110 be different depending on the position in the wire rod longitudinal direction L. In other words, it is preferable that the average value of the lengths of the inclined grooves 110 be appropriately changed for the following reason. In general, when the superconducting wire rod is exposed to a magnetic field, the critical current decreases, and the decrease rate of the critical current changes depending on the intensity or direction of the magnetic field to which the superconducting wire rod is exposed. Furthermore, in the pancake coil, the intensity and direction of the magnetic field to be formed vary depending on the position in the radial direction. Therefore, the critical current varies depending on the portion of the pancake coil. As described above, when the mean square of the energization current is small with respect to the coil permissible current, it is preferable that the average length in the width direction of the inclined grooves 110 is increased. The average length in the width direction of the inclined grooves 110 may be changed according to the variation of the critical current inside the coil. Specifically, the average length in the width direction of the grooves 110 is increased to the outer diameter side of the pancake coil, whereby the hysteresis loss can be more effectively reduced.

In the first embodiment, on the assumption of application to a double pancake coil, the grooves 110 are provided only at one end portion (end region 150A) in the wire rod width direction z. However, the present disclosure is also applicable to a single pancake coil. In the case of the single pancake coil, shielding current bands are also formed on both outsides in the coil axis direction as in the case of the double pancake coil. Therefore, in the case of the single pancake coil, the inclined grooves may be evenly formed on both end sides in the wire rod width direction z, and an intact region may be left at the center portion in the wire rod width direction z. In the case of application to a multi-pancake coil system including laminated three or more pancake coils, the inclined grooves may be formed on both sides in the wire rod width direction z. Here, in the case of the multi-pancake coil system, it is preferable that the number or length of the grooves is not uniform on both the sides in the wire rod width direction z, but formed so as to be weighted toward the outside in the axial direction of the entire coil system at which a shielding current band is more apt to be formed. In any of the thus-configured coils, grooves may be formed at a portion where a shielding current band is formed, according to easiness of the formation of the shielding current band.

(4) SECOND EMBODIMENT

Figure 5:
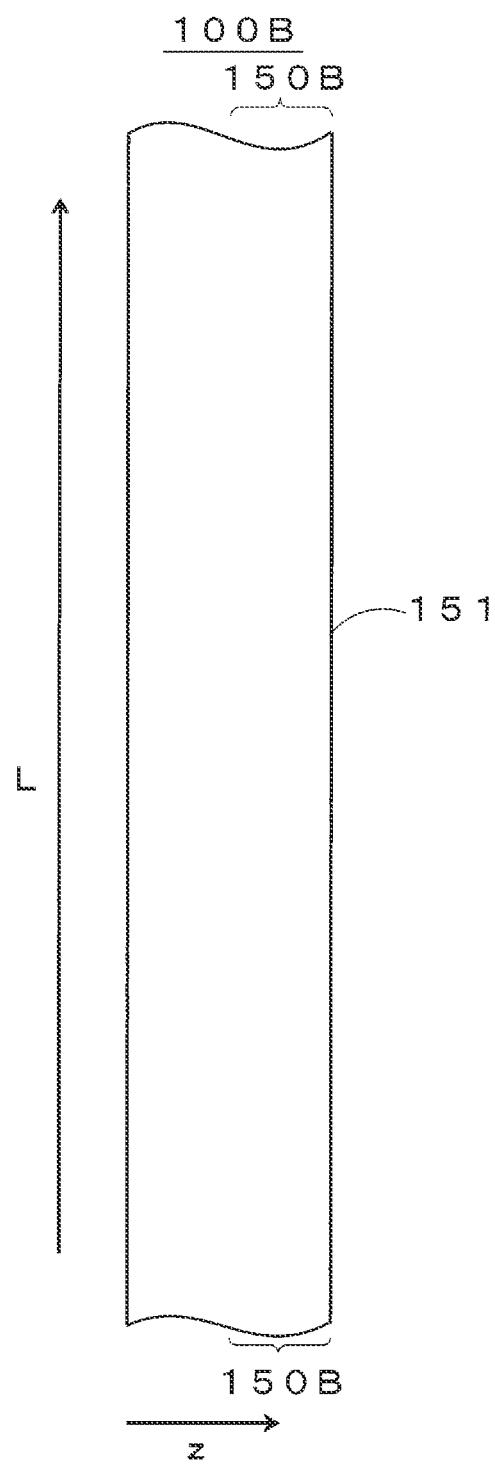
FIG. 5 is a diagram showing a high-temperature superconducting wire rod according to a second embodiment to which the present disclosure is applied.

The superconducting wire rod to which the present disclosure is applied includes a mechanism that is provided in a region on an end side in the wire rod width direction z and generates a voltage with a lower current density as compared with the other region. The mechanism is not limited to the grooves as shown in the first embodiment. In a superconducting wire rod according to a second embodiment, for example, the critical current density of one of both ends (only one side) in the wire rod width direction z, that is, the critical current density of an end region 150B shown in FIG. 5 is lowered, whereby the end region on the outside in the width direction generates a voltage with a lower current density or generates a higher voltage with the same current density as compared with the other region. In the REBCO wire rod, when the superconducting layer is heated to about 300° C., the critical current decreases depending on the temperature or the heating time. By utilizing this point, when an end 151 side of the end region 150B is heated while cooling the region other than the end region 150B, a temperature gradient is formed in the wire rod width direction z, and a structure in which the critical current density gradually decreases as shifting to the end 151 of the end region 150B. Particularly, as is apparent from a second example described later, the hysteresis loss can be suppressed so as to be small as in the case of the foregoing first embodiment by setting the critical current density of the end 151 to substantially not more than the maximum value in the slope distribution, in other words, substantially not more than half of the critical current density in the region other than the end region 150B. As a result, the total heat value which also considers the Joule heat generation, etc. can be reduced as compared with the case in which no heat treatment is conducted.

(5) EXAMPLES (5-1) First Example

In a first example, a case in which a REBCO wire rod of 200 m having a width of 4.0 mm is wound around a bobbin made of FRP (Fiber Reinforced Plastic) and having an outer diameter of $\phi$120 mm to make a circular double pancake coil, the circular double pancake coil is cooled to 40 K by conduction cooling, and then energization is performed is considered as a specific example of the superconducting coil using the superconducting wire rod of the first embodiment. A protective layer (stabilizing layer) which the REBCO wire rod has over the whole length includes a protective layer of silver having a total thickness of 5 μm (corresponding to the protective layer 104), and a stabilizing layer of copper having a total thickness of 40 μm (corresponding to the stabilizing layer 105). The protective layer of silver is formed solely on the superconducting layer by sputtering, and the stabilizing layers of copper are formed at intervals of 20 μm by plating so as to surround the wire rod. The REBCO wire rod includes a Hastelloy substrate having a thickness of 50 μm, but it is not included in the protective layer (stabilizing layer) because it has relatively low electrical conductivity and thermal conductivity. In the double pancake coil according to the present example, the average thickness of the wire rod is slightly less than 100 μm, the number of turns of the wound coil is equal to 212 per each pancake coil, the diameter of the outermost turn is equal to $\phi$180 mm, and the average turn interval is equal to 140 μm (0.14 mm). However, an insulation tape (polyimide tape) having a thickness of 30 μm is co-wound between the turns, and is further impregnated with epoxy resin after formation of the coil. The upper and lower pancake coils constituting the double pancake coil share the same bobbin, the interval in the coil axial direction (the thickness of the gap) between the upper and lower pancake coils is equal to 4 mm, and the thickness of the overall double pancake coil is equal to 12 mm. The innermost turns of the upper and lower pancake coils are shared as a bridging portion, and copper electrodes are soldered to the outermost peripheries of the upper and lower pancake coils one by one.

Furthermore, in the present example, inclined grooves having the following configuration are dug on the superconducting layer side of the REBCO wire rod constituting the coil. First, a 100 mm portion which is half of the above-described REBCO wire rod of 200 mm is used to form one pancake coil. For the region of the half portion, grooves starting from the end portion on the outside in the axial direction of the double pancake coil are dug at intervals of 2 cm in the wire rod longitudinal direction. The depth of the grooves was set so as to reach the Hastelloy substrate, and the width of the grooves was set to 30 μm. The inclined angle was set at a ratio of 10 cm in the wire rod longitudinal direction to 1 mm in the wire rod width direction. The grooves include short grooves and long grooves, which were periodically arranged at a ratio of one long groove to two short grooves (at this time, the interval in the wire rod longitudinal direction of the long grooves is equal to 6 cm). Furthermore, the lengths of these grooves were not uniform, and were set to have a distribution close to a critical current distribution in the wire rod longitudinal direction at that position. That is, first, at the wire rod center portion located at the innermost diameter position of the double pancake coil, the short grooves of a 1 mm portion were provided in the wire rod width direction (10 cm in total length), and the long grooves of a 2 mm portion were provided in the wire rod width direction (20 cm in total length). The average value of the lengths of the grooves at this point is equal to (10×2+20×1)/3=13.3 cm. In a region extending from the center portion of the wire rod to a position of 50 m, the length of each groove was lengthened according to the distance from the wire rod center portion. In a region beyond the point of 50 m from the wire rod center portion, the short grooves were fixed at 1.5 mm in the wire rod width direction and the long grooves are fixed at 2.5 mm in the wire rod width direction. The average value of the lengths of the grooves in this region is equal to (15×2+25×1)/3=18.3 cm. In this setting, the inclined angle of the grooves is equal to 0.01 rad which is excessively small, and when a part of the wire rod is enlarged, the grooves look as if plural parallel grooves extend in the wire rod longitudinal direction. In the neighborhood of the center of the wire rod, the 1 mm portion on the outside in the width direction looks as if it is divided into fine lines of slightly less than 0.2 mm in width by four grooves, and the 1 mm portion on the inside of the above 1 mm portion in the width direction looks as if it is divided into fine lines of slightly less than 0.6 mm in width by one or two grooves. The remaining 2 mm portion on the inside in the width direction is intact.

In a 100 m portion on the opposite side at which the other pancake coil will be formed, grooves were dug so as to have a configuration obtained by reversing the foregoing grooves symmetrically with respect to the upper and lower sides and the right and left sides (in the longitudinal direction and the width direction).

The digging of the grooves is performed at a stage after the silver protective layer is formed on the superconducting layer. The grooves as described here may be dug, for example, by the scribe processing using a laser beam. Thereafter, an additional silver layer is formed by sputtering to be filled in the dug grooves. The thickness of the additional silver layer may be set to the extent that the superconducting layer is not exposed in the neighborhood of the grooves, and further specifically, the thickness may be about the thickness corresponding to the difference in height from the top surface of the superconducting layer to the deepest portion of the groove. Thereafter, oxygen anneal processing is further performed, and then a copper stabilizing layer (the thickness of one side is 20 μm) is finally formed. Since the copper layer is also formed on the grooves, the traces of the grooves are regarded as an uneven structure of the copper layer on the external appearance.

Next, the coil characteristic of the superconducting coil according to the first embodiment configured described above will be described as follows. There is considered a case where a double pancake coil which has the same configuration, but has no inclined groove formed in the same REBCO wire rod as the superconducting coil according to the first embodiment is made as a superconducting coil according to a comparative example 1, likewise cooled to 40 K by conduction cooling, and then energized. When this coil is cooled to 40 K and slowly energized, a voltage which is not induced electromotive force starts to appear at the time when the energization current reaches 200 A. By using the expression "permitted current" described above, this situation can be expressed as "the permissible current of this coil at 40 K is 200 A". When this coil is incorporated into an actual system and operated, thirty percent of the permitted current is set as a margin for abnormality, and the coil is normally driven with a constant current of 140 A. Even when the system falls into an overloaded state and the coil is energized with an overcurrent, no problem arises in this coil when the overcurrent is not more than 200 A.

On the other hand, no voltage occurred when the superconducting coil according to the first embodiment was energized with a constant current of 140 A for a while. This means that all the current of 140 A flows through the region on the inside of the wire rod in the width direction where no groove is dug, and no current flows through the region on the outside where the grooves are dug. It seems strange at a glance that the permitted current of the coil of the comparative example 1 is 200 A, and a current of 140 A corresponding to 70% of the permitted current flows through an intact region which is merely 50% at maximum in terms of the width-direction conversion. This can be explained as follows. That is, the permissible current of the coil is strongly influenced by a magnetic field generated by itself. Since a magnetic field generated under energization of 140 A is weaker than a magnetic field generated under energization of 200 A, and the decrease of the critical current at each portion is also smaller, current can be made to flow with higher current density under energization of 140 A. Furthermore, the magnetic field to be formed is stronger toward the inner diameter side of the coil. The strength-dependence of the magnetic field is stronger than the angle-dependence of the magnetic field with respect to the critical current of the REBCO wire rod at 40 K. Therefore, in this state, the critical current is lower and the current density that can be made to flow becomes lower as the turn nears the inner diameter side. In the superconducting coil according to the first example, the configuration of the grooves is set so that the intact region is broader as the position nears to the inner diameter side in consideration of the foregoing point.

Next, when the superconducting coil according to the first example was energized with a constant current of 160 A for a while, a voltage of 0.25 mV steadily occurred in the whole coil. At this time, it is calculated that heat of about 40 mW is generated in the whole coil. However, this level of heat generation is sufficiently small as compared with intrusion heat from a current lead or the like, and has little influence on the driving of the coil. In the case of the superconducting coil according to the comparative example 1, as described above, no stationary voltage is generated by this level of overcurrent energization.

The heat value generated in the coil is roughly estimated as follows on the assumption that when a constant current of 160 A is made to flow in the superconducting coil according to the first embodiment, a part of the current flows in the region where the grooves are dug, thereby causing Joule heat. It is considered that a part of the current protruding from the intact region flows in a region having a small number of grooves, that is, in a 1 mm portion near to the center in the wire rod width direction in which the grooves extend at intervals of 6 cm. When passing over a groove, current flows in the copper stabilizing layer (+ the silver protective layer) through a route having a shortest distance (a route perpendicular to the groove). The distance corresponds to 30 µm which is the width of the groove. However, in consideration of the actual route, the average travel is likely to be a little longer than the above value, and in this case, the average value is set to 40 µm. The cross-sectional area is equal to the product of the length of the groove and the thickness of the stabilizing layer (+ the protective layer). The thickness of the stabilizing layer is equal to 20 µm, and is further added with the thickness of the silver protective layer. In this case, in order to simplify the calculation, only the thickness of the copper stabilizing layer of 20 µm is considered. The length of the groove is equal to 10 cm=0.1 m which is equivalent to the 1 mm portion of the wire rod width. The electric conductivity of copper at 40 K is equal to 0.5 nΩ·m (assuming RRR>50), and the electric resistance when the current passes over one groove is calculated as approximately 10 nΩ from the foregoing values. Since these grooves are dug at intervals of 6 cm, about 3300 grooves are carved in the 200 m length portion of the wire rod constituting the coil, and the electric resistance caused by these grooves is calculated as 33000 nΩ=33 µΩ. Supposing that all of 20 A added to 140 A which is expected to flow through the intact region flows in this region, a voltage of approximately 660 µV=0.66 mV would be generated. This is the maximum value of the voltage which can be assumed to be generated. However, actually, a part of the added 20 A also flows through the intact region, so that the consequently generated voltage remains at 0.25 mV.

As described above, the electric resistance of the region having a small number of grooves was equal to 33 µΩ as the entire double pancake coil. In the region where the short grooves are also dug, the number density of the grooves is three times, so that the electric resistance is also three times, that is, is equal to 100µΩ=0.1 mΩ. This is relatively large electric resistance among superconducting coils. In consideration of this point, how much the AC loss will decrease under an approximation that no shielding current band is formed in the region where the grooves are dug even when the coil is exposed to some external magnetic field variation is considered. At this time, the same hysteresis loss as the same type coil made by using a wire rod of 1.5 to 2.0 mm in width occurs. In the case of the same energization current, the hysteresis loss is proportional to the thickness of the pancake coil (=the width of the wire rod). Therefore, there is obtained a result indicating that when the reduction rate of the hysteresis loss is integrated in the longitudinal direction of the wire rod, the hysteresis loss is reduced by about 60% as compared with the superconducting coil according to a comparative example having no inclined grooves.

From the above result, in a case where the current varies to the extent that the maximum current does not exceed 140 A in the superconducting coil according to the first embodiment where the inclined grooves are formed, and heat generation caused by the hysteresis loss when similar energization is performed on a coil having no inclined groove is equal to 1 W, 600 mW corresponding to 60% of 1 W is reduced. At this time, the stationary Joule heat generation caused by the inclined grooves does not occur. Furthermore, in a case where when the variation amplitude is not large at the average current of 160 A, the Joule heat generation caused by the inclined grooves is equal to about 40 mW, and the hysteresis loss when similar energization is performed on the coil having no inclined groove is equal to 1 W, 600 mW corresponding to 60% of 1 W is reduced by the inclined grooves, and reduction of the heat generation of totally 560 mW can be realized by the inclined grooves.

When the coil is exposed to more severe magnetic field variation, the approximation of "no shielding current band is formed in the region where the grooves are dug" described above is not appropriate. That is, a shielding current band is formed on the outside in the width direction where the grooves are dug, and the reduction rate of the hysteresis loss decreases. In this case, the electric resistance of the region on the outside in the width direction may be increased by reducing the grooving interval or the like, which reduces the current amount of the formed shielding current band, so that decrease of the reduction rate of the hysteresis loss can be suppressed.

Conversely, when the electric resistance in the region on the outside in the width direction is small, the reduction rate of the hysteresis loss can be expected by only a moderate magnetic field variation. In relation to this point, the effect of reducing the AC loss will be compared between a wire rod having inclined grooves and a wire rod having divided fine lines.

First, a situation in which the superconducting coil 140 A according to the comparative example 1 is energized and then de-energized to 0 A is considered. At this time, even when the current of the entire coil is equal to 0 A, the current density is not necessary equal to zero everywhere. When energized up to 140 A, a shielding current band in the forward direction is formed on the outside in the width direction, and under subsequent de-energization, a shielding current band in the reverse direction is formed on the outside in the width direction. When the energization/de-energization is performed sufficiently rapidly, under the foregoing (0 A) situation, a shielding current band of −70 A in the reverse direction is formed on the outside in the width direction, and a shielding current band of +70 A in the forward direction is formed on the inside of the former shielding current band, the total net transport current is equal to 0 A.

Here, it is assumed in both the pancake coils that a uniform shielding current band of −70 A in the reverse direction is formed at the 1 mm portion on the outside in the width direction, a uniform shielding current band of +70 A in the forward direction is formed at the 1 mm portion on the inside of the former uniform shielding current band, and no current flows in the remaining half region on the inside in the width direction. At this time, the coil accumulates energy in the form of a magnetic field generated around the coil by the coil itself. The amount of the energy is represented by the following expression.

$$U = \frac{1}{2} \int (\vec{j} \cdot \vec{A}) d^3 \vec{r} \qquad \text{[Expression 1]}$$

Here, vector j represents the current density, and vector A represents the vector potential. A value obtained by integrating the inner product of these vectors over the whole space and dividing the integration value by two is equal to magnetic energy accumulated by the coil. When the value is calculated for the foregoing state, the value is calculated as 1.3 J. In a case where the current in the reverse direction and the current in the forward direction are regarded as one circuit, that is, when all the route is a perfect superconductor, no voltage occurs in the route, this magnetic energy is held as it is without being reduced, and both the shielding current bands are held as they are. This is what is called a persistent current.

Next, a case in which the superconducting coil according to the first embodiment where the inclined grooves are dug is considered. However, in order to simplify the calculation, the configuration is changed so that the lengths of the inclined grooves are constant irrespective of the position of the wire rod, and the short grooves are provided at the 1 mm portion of the wire rod width direction (10 cm in total length) while the long grooves are provided at the 2 mm portion in the wire rod width direction.

When the variation speed of the current is sufficiently low, all the current flows through the region on the inside in the width direction where no groove is dug in the wire rod as assumed above. However, in this case, in order to calculate a current (magnetic field) variation speed at which the AC loss reducing effect can be expected in the superconducting coil according to the first embodiment, it is assumed that a current distribution in the wire rod width direction similar to that of the comparative example 1 is formed. At this time, the current in the reverse direction flowing through the outside in the width direction in the one pancake coil has to pass through all of 5,000 grooves, and the current in the forward direction flowing through the inside has to pass all of 1,660 long grooves. Therefore, the current passes through 6,660 grooves while making a round of the circuit. Since the electric resistance when the current passes over one groove at 40 K is equal to 10 nΩ as described above, the electric resistance of the whole circuit is equal to 66,600 nΩ≅67 μΩ. Here, when current of 70 A flows, the voltage drop as the whole circuit is equal to 4,690 μV≅4.7 mV, and consumption power of 70 A×4.7 mV=329 mW≅0.33 W occurs. In both the pancake coils, the double energy of the above energy is consumed, and, at this speed, the energy of 1.3 J is estimated to be consumed in less than 2 seconds. As the shielding current decreases, the energy consumption speed also slows down, and correctly the original energy is reduced to 1/e in less than 2 seconds. However, it is calculated that 90% or more of the magnetic energy accumulated by the coil is lost in 5 seconds. Dissipation of the magnetic energy means disappearance of both the shielding current bands. That is, when de-energization of 140 A is performed on the superconducting coil according to the first embodiment for 5 seconds, formation of the shielding current band can be inhibited to a considerable extent. Actually, both the shielding current bands are shifted to the inside in the width direction where no groove is provided, and remain there. This means "the shielding current bands are formed in 2 mm regions on the inside in the width direction by performing de-energization of 140 A for 5 seconds". This is the same situation as in the case of a coil made of a 2 mm-wide wire rod having a half width, and the hysteresis loss to the same level current variation or external magnetic field variation can be reduced to the half level.

Subsequently, a wire rod in which the following width-direction divisional grooves are dug is considered. Specifically, a similar double pancake coil in which a 4 mm-wide portion is divided into ten parts by nine grooves, and re-formation of a silver protective layer and formation of a copper stabilizing layer are likewise performed after grooves are dug, and the resultant is set as a comparative example 2. The structure of the grooves are set to the same as inclined grooves. Considering a circuit for a shielding current which is likewise formed in one pancake coil as in the case of the comparative example 1 on the assumption that, in both pancake coils, a uniform shielding current band of −70 A in the reverse direction is formed at a 1 mm portion on the outside in the width direction, a uniform shielding current band of +70 A in the forward direction is formed at a 1 mm portion on the inside of the former 1 mm portion, and no current is made to flow through the remaining half region on the inside in the width direction, grooves on only both the end portions of the wire rod are grooves through which the current passes while making a round of this circuit, and the number of the grooves is equal to 2.5 in average for one end, for a total of only five. Even when the width of the current path in the wire rod longitudinal direction at both the end portions is set to 10 cm=0.1 m, the electric resistance of the current path is merely 50 nΩ. Furthermore, even when the electric resistance when passing over the groove is increased by one figure with metal alloyed by mixing silver with a small amount of gold as the protective layer or the like, the electric resistance is equal to 500 nΩ=0.5 μΩ. This is smaller by two or more figures as compared with the electric resistance of the superconducting coil according to the first embodiment described above. That means that the power consumption by the shielding current band is also smaller by two or more figures, and it takes a time longer by more than two figures to consume the magnetic energy accumulated in the coil. Therefore, even when de-energization of 140 A is performed on the superconducting coil according to comparative example 2 for 5 seconds, the effect of inhibiting formation of the shielding current band or the effect of confining the shielding current band in a specific region can hardly be expected, the same level of hysteresis loss as a coil formed of an intact wire rod occurs.

(5-2) Second Example

In a second example, a specific example of the superconducting wire rod according to the second embodiment will be described.

For example, by performing the following heat treatment, the superconducting wire of the second embodiment can be made to have a slope distribution in which the critical current density decreases toward the end in the wire width direction, and the critical current density at the end can be set to be substantially not more than half of the maximum value in the slope distribution. First, one end of a 4 mm-wide metal plate is heated to form a temperature gradient in which 300° C. is set at one end and 200° C. is set at another end. A REBCO superconducting wire rod is set so as to pass over the metal plate at a constant speed, and is transported so as to change the winding of the wire rod from one reel to another reel. A certain point of the wire rod passes over this metal plate over the course of 5 minutes during the transportation, and during this time it is heated at the temperature along the temperature distribution of the metal plate. Also, before and after passing through the metal plate, the wire rod is quickly cooled by forced air cooling.

Figure 6:
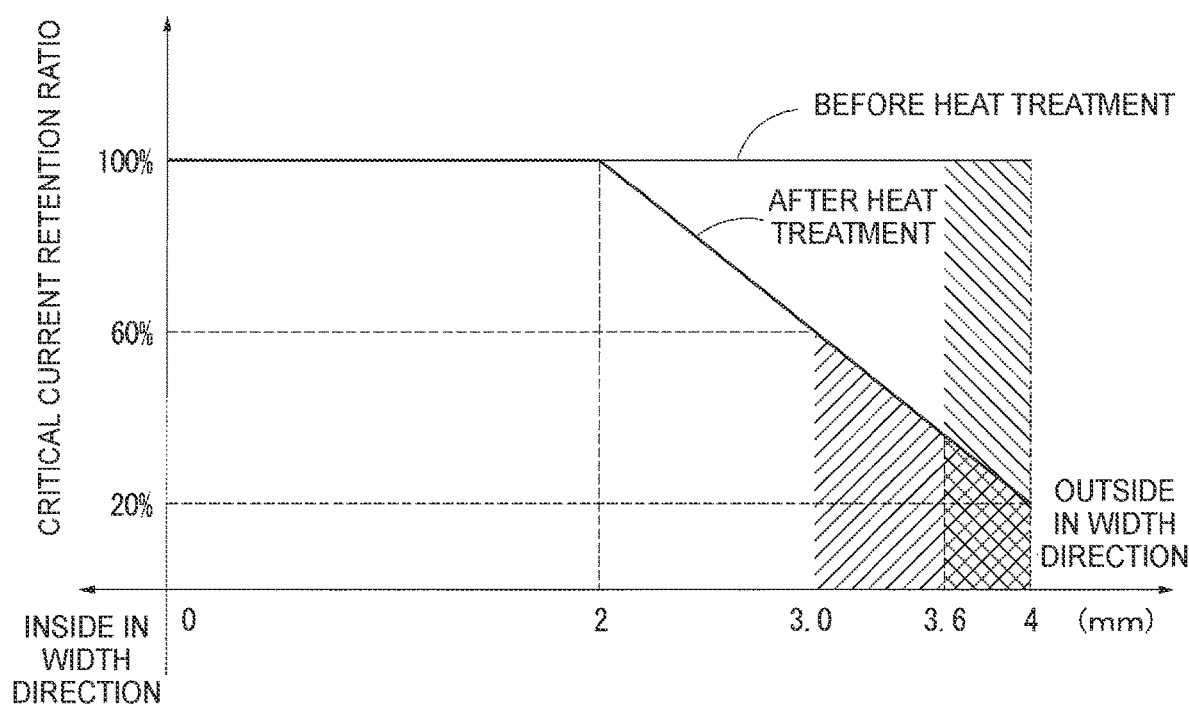
FIG. 6 is a diagram showing variation of the retention ratio of a critical current depending on the position in the wire-rod width direction in the high-temperature superconducting wire rod according to a second example.

Here, when a heating experiment was conducted on this REBCO wire rod, the critical current decreased to 20% of the original under heating at 300° C. for 5 minutes. On the other hand, the critical current did not decrease even when heated at 250° C. or less for 5 minutes. In the case of heating at 250° C. to 300° C., the reduction rate of the critical current density should be intensified according to the temperature, and in this case, it is assumed that the critical current density linearly decreases with respect to the heating temperature. The hysteresis loss reduction rate of the coil in the superconducting wire of the second embodiment is calculated under such an assumption. When the above-described heat treatment is performed on this REBCO wire rod, the critical current density distribution of the wire rod is as shown in FIG. 6. In FIG. 6, the ordinate axis represents the retention ratio of the critical current density after the heat treatment to the critical current density before the heat treatment, and the abscissa axis represents the position in the width direction of the REBCO wire rod. The critical current density does not decrease at the 2 mm portion on the inside in the width direction which does not reach 250° C. or more, and decreases to 20% of the original critical current density on the outermost side in the width direction. At a position between the 2 mm portion and the outermost side, the reduction rate of the critical current density becomes higher toward the outside at a rate of 40% per 1 mm. By performing this treatment, the critical current over the entire width decreases to 80% before the treatment. It may be assumed that the critical current density before the heat treatment is substantially uniform with respect to the wire rod width direction.

A REBCO wire rod having a total length of 200 m is prepared, and the foregoing heat treatment is conducted on a region of 80 m (160 m when summing the regions on both sides) ahead of a position which is away from the center of the wire rod by 20 m. When this wire rod is coiled in the same shape as the superconducting coil according to the comparative example 1, and then the critical current at 40 K in consideration of the effect of the magnetic field generated by the coil itself is calculated, the critical current was lowest on the innermost diameter side which was not subjected to the heat treatment. That is, since the magnetic field to which the region subjected to the heat treatment is exposed after being coiled is weak, even when the critical current is reduced by 20% through the heat treatment, it is possible to maintain a higher critical current than that in the region on the innermost diameter side which is exposed to the strongest magnetic field. That is, this heat treatment does not influence the permissible current of the coil at all.

Here, in the superconducting coil according to the comparative example 1 which was made of a wire rod subjected to no heat treatment, energization was performed up to the current corresponding to 10% of the critical current at a certain turn in the neighborhood of a middle at a certain speed. At this time, a shielding current band is formed in a 0.4 mm region corresponding to 10% of the outside in the width direction in this turn, and almost no current flows into a region on the inside of the above region. An oblique line sloping downwards to the right in FIG. 6 shows the current density distribution at that time. On the other hand, when a similar excitation magnet is used for the superconducting coil according to the second example, the current density distribution in the same turn has a shape as shown by an oblique line sloping upwards to the right in FIG. 6. In the same way, almost no current flows into a region on the inside of the shielding current band, but the width of the shielding current band spreads to 1.0 mm. Considering that the magnetic moment as the source of the hysteresis loss is proportional to the current and the wire rod width, it is calculated that this effect reduces the hysteresis loss by 10%. Furthermore, assuming that reduction in hysteresis loss occurs at all turns subjected to the heat treatment excluding a 20% portion closer to the center of the wire rod, the reduction rate of the hysteresis loss in the entire coil can be estimated as being about 8% as compared with that of the superconducting coil according to the comparative example 1. Synthesizing the above verification results, the heat value can be reduced as compared with the comparative example 1.

As described above, the hysteresis loss reduction rate of the superconducting coil according to the second example is lower than that of the superconducting coil according to the first example. However, since not the electric resistance, but reduction of the critical current density is used as an element for inhibiting the formation of the shielding current band in the second example, even under a more intense magnetic field variation, for example, a magnetic field variation in which de-energization of 140 A is performed in 0.5 seconds, it is possible to maintain a hysteresis loss reduction rate of about 8%, so that a merit of enabling reduction of the heat value can be obtained.

(6) OTHERS

The present disclosure is not limited to the above-described embodiments and examples, and various modifications are possible. For example, the superconducting wire rod is not limited to the REBCO wire rod 100, and can be applied to a superconducting wire rod having a flat cross-sectional shape.

FIG. 6
1 CRITICAL CURRENT RETENTION RATIO
2 BEFORE HEAT TREATMENT
3 AFTER HEAT TREATMENT
4 INSIDE IN WIDTH DIRECTION
5 OUTSIDE IN WIDTH DIRECTION

What is claimed is:
1. A superconducting wire rod having a flat cross-sectional shape, wherein a voltage is generated with a lower current density or a higher voltage is generated with the same current density in a region on at least one end side in a wire rod width direction as compared with a region other than the region on the at least one end side,
   wherein an average value of lengths of grooves of the superconducting wire rod is different according to a position in a wire rod longitudinal direction, and
   wherein the superconducting wire rod forms a superconducting pancake coil wound spirally within an identical plane, and the average value of the lengths of the grooves increases to an outside in a radial direction of the superconducting pancake coil.
2. A superconducting wire rod having a flat cross-sectional shape, wherein a superconducting layer of the superconducting wire rod is provided with grooves that extend from one end or both ends in a wire rod width direction while in an inclined fashion with respect to a wire rod longitudinal direction, and terminate without reaching another end, and whose grooves are filled with metal,
   wherein an average value of lengths of the grooves is different according to a position in the wire rod longitudinal direction, and
   wherein the superconducting wire rod forms a superconducting pancake coil wound spirally within an identical plane, and the average value of the lengths of the grooves increases to an outside in a radial direction of the superconducting pancake coil.

* * * * *